(12) United States Patent
Bushman et al.

(10) Patent No.: US 6,417,912 B1
(45) Date of Patent: Jul. 9, 2002

(54) METHOD AND APPARATUS FOR CONTROLLING OPTICAL-PARAMETERS IN A STEPPER

(75) Inventors: Scott Bushman, Richardson; Anthony John Toprac; Richard David Edwards, both of Austin; Edward Christopher Stewart, Buda, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/814,231

(22) Filed: Mar. 21, 2001

(51) Int. Cl.[7] .................. G03B 27/52; G03B 27/42; G03B 27/54; A61N 5/00; G21K 5/10
(52) U.S. Cl. .................. 355/30; 355/53; 355/62; 355/71; 355/67; 355/77; 250/492.2; 250/492.22
(58) Field of Search .................. 355/30, 53, 62, 355/71, 67, 77; 250/492.2, 492.22

(56) References Cited

U.S. PATENT DOCUMENTS

| | | | |
|---|---|---|---|
| 5,661,548 A | * | 8/1997 | Imai .................. 355/55 |
| 5,710,620 A | * | 1/1998 | Taniguchi .................. 355/53 |
| 5,739,899 A | * | 4/1998 | Nishi et al. .................. 355/53 |

* cited by examiner

Primary Examiner—Russell Adams
Assistant Examiner—Khaled Brown
(74) Attorney, Agent, or Firm—Williams, Morgan & Amerson (57) ABSTRACT

In one illustrative embodiment, a system is provided for controlling a lens of an optical system of a stepper. The system comprises the stepper, the optical system, and a controller. The stepper has a light source controllably energizable to provide light to a surface of a semiconductor device. The lens of the optical system has a controllable focus. The controller is capable of determining a temperature of the lens, and controllably varying the focus of the lens in response to the temperature of the lens.

4 Claims, 6 Drawing Sheets

METHOD AND APPARATUS FOR CONTROLLING OPTICAL-PARAMETERS IN A STEPPER

BACKGROUND OF THE INVENTION

1. Field of the Invention

The present invention is generally related to the field of semiconductor processing, and, more particularly, to a method and apparatus for controlling the amount of light energy delivered to a layer of photoresist on a semiconductor device.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., a gate insulation layer, a gate electrode, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product that may be changed from a relatively soluble state to a relatively insoluble state by exposure to a light source. There are positive and negative photoresists currently available on the market.

The photolithography process generally involves forming a layer of photoresist above a previously formed process layer, and exposing selected portions of the layer of photoresist to a light source to form a pattern in the photoresist. The pattern formed in the photoresist is subsequently transferred to the underlying process layer. All of these steps are typically performed in well-known photolithography modules that include a section for depositing the photoresist on the wafer, e.g., a spin-coating station, a device for selectively exposing portions of the photoresist layer to a light source through a reticle or photomask, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is typically removed so that additional process layers may be formed above the now patterned process layer.

The purpose of the photoresist application step is to form a thin, uniform, defect-free layer of photoresist above the substrate surface. Typically, the photoresist is developed by exposing it to a light source through an optical system for a preselected duration of time. Ordinarily, the optical system has a number of parameters, such as numerical aperture, focus, coherence, and the like. Often, these parameters are adjusted to a desired setting, which is intended to produce a suitable image on the layer of photoresist. Over time, however, outside factors, such as environmental conditions, may cause the settings to drift or render them less effective. For example, variations in barometric pressure, temperature, and the like may result in the current focus no longer producing the desired image on the layer of photoresist.

Poor focus may have undesirable effects on the developed layer of photoresist. That is, dimensions of the patterns formed in the photoresist may be affected by other than ideal focus. This dimensional variation may carry over to the features that are to be formed in the semiconductor device, and, thus, affect the operation of the semiconductor device, or in the worst case render it inoperable.

The present invention is directed to a method of solving, or at least reducing the effects of, some or all of the aforementioned problems.

SUMMARY OF THE INVENTION

In one aspect of the present invention, a method is provided. The method is comprised of energizing a light source. A temperature of a lens used to focus the light source is determined, and then a desired focus of the lens based upon the temperature of the lens is determined. The focus of the lens is set at the desired focus, and then a device is exposed to the light source through the lens.

In another aspect of the instant invention, a system is provided. The system comprises a stepper, an optical system, and a controller. The stepper has a light source controllably energizable to provide light to a surface of a semiconductor device. The optical system has a lens with a controllable focus. The controller is capable of determining a temperature of the lens, and controllably varying the focus of the lens in response to the temperature of the lens.

In yet another aspect of the instant invention, a method is provided. The method is comprised of energizing a light source. The light source is exposed to a device through a lens, wherein the lens is set to a first preselected focus. A parameter of the device is measured, and a second preselected focus is determined based on the measured parameter. The focus of the lens is set to the second preselected value for processing of subsequent devices.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of controlling certain optical parameters, such as focus, in a stepper in a semiconductor manufacturing line. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. Moreover, it is readily applicable to forming a variety of features on a semiconductor device, such as gate electrodes, conductive metal lines or contacts, etc.

Figure 1:
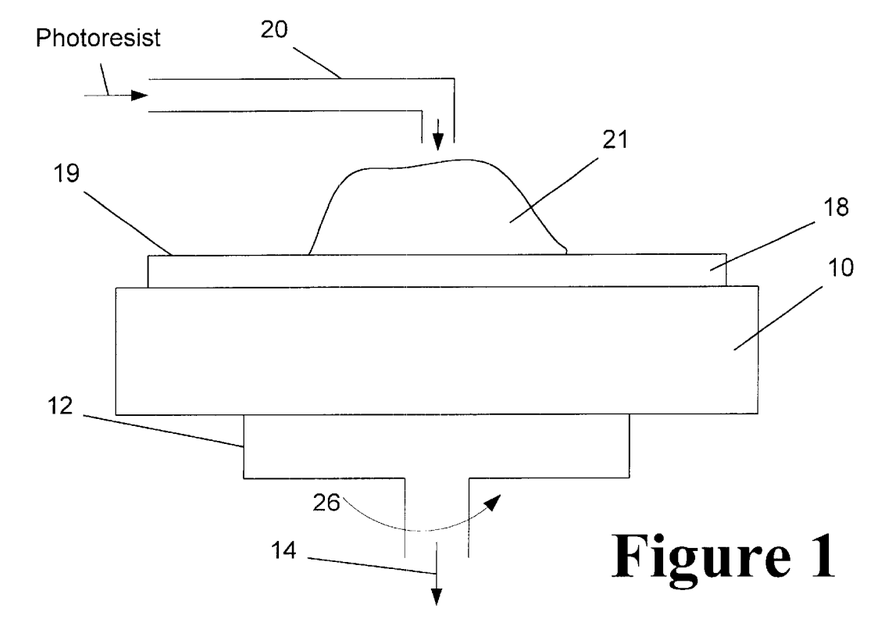
FIG. 1 is a cross-sectional view of a process whereby a quantity of photoresist is positioned on a previously formed process layer.
Figure 2:
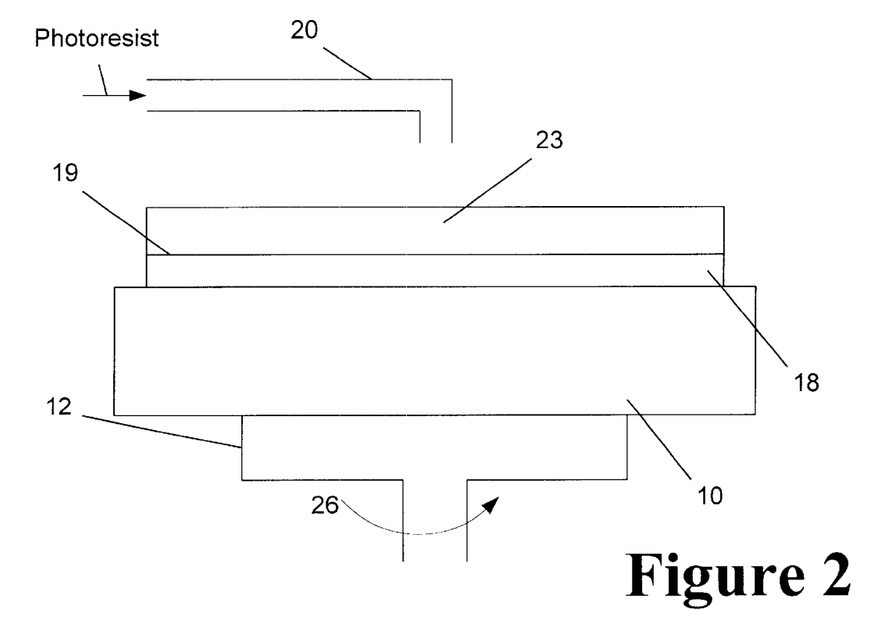
FIG. 2 is a cross-sectional view of a layer of photoresist formed by a spin-coating process.

As shown in FIG. 1, a wafer or semiconducting substrate 10 having a process layer 18 formed thereabove is positioned on a rotational element, such as a vacuum chuck 12. A vacuum may be applied, as indicated by arrow 14, to secure the substrate 10 to the vacuum chuck 12. The vacuum chuck 12 and the substrate 10 are capable of being rotated in the direction indicated by arrow 26. Photoresist from a source (not shown) is applied on the process layer 18 via a dispenser arm 20. As shown in FIG. 1, a puddle of photoresist 21 is formed above the process layer 18. The substrate 10 may or may not be rotating at the time the puddle of photoresist 21 is deposited on the process layer 18. Thereafter, as shown in FIG. 2, the substrate 10 is rotated such that the photoresist material is spread across a surface 19 of the process layer 18, forming a layer of photoresist 23 above the surface 19 of the process layer 18.

As will be recognized by those skilled in the art, the process layer 18 is meant to be illustrative only in that it may be comprised of any of a variety of materials, and there may be one or more intervening process layers between the process layer 18 and the substrate 10. For example, the process layer 18 may be comprised of an oxide, an oxynitride, a nitride, silicon dioxide, silicon nitride, a metal, polycrystalline silicon ("polysilicon"), or any other of a variety of materials used in semiconductor processing that may be patterned using photolithographic techniques. Moreover, the photoresist used with the present invention may be either a positive or negative type photoresist.

In the disclosed embodiment, the layer of photoresist 23 is formed by a spin-coating process. In many modern fabrication facilities, a spin-coating process involving a moving dispenser arm 20 is used to form layers of photoresist. In that process, the substrate 10 is rotated at a relatively low speed prior to the deposition of any photoresist material 21 on the process layer 18. As the photoresist material 21 is deposited on the substrate 10, the dispenser arm 20 moves in a more or less radially outward fashion, beginning at the center of the substrate 10 and moving outward. This technique is used to more evenly distribute the photoresist across the surface 19 of the process layer 18.

Of course, as will be apparent to those skilled in the art upon reading the present application, the present invention is not limited to this particular spin-coating technique. For example, the present invention may also be used in processing techniques in which the dispenser arm 20 remains at the approximate center of the substrate 10. In that situation, the substrate 10 is initially rotated at a relatively low speed and photoresist material 21 is dispensed on the approximate center of the process layer 18. At that time, the rotational speed of the substrate is increased to disperse the photoresist. In yet another alternative embodiment, a static-type spin-coating process may be used in which the photoresist material 21 is deposited in the approximate center of a process layer 18 while the process layer 18, i.e., wafer 10, is stationary. Thereafter, the substrate 10 is rotated to disperse the photoresist evenly across the surface 19 of the process layer 18. If desired or required, a separate primer coating process may also be used prior to applying the photoresist above the process layer 18 in any of the above-described spin-coating methods.

Figure 3:
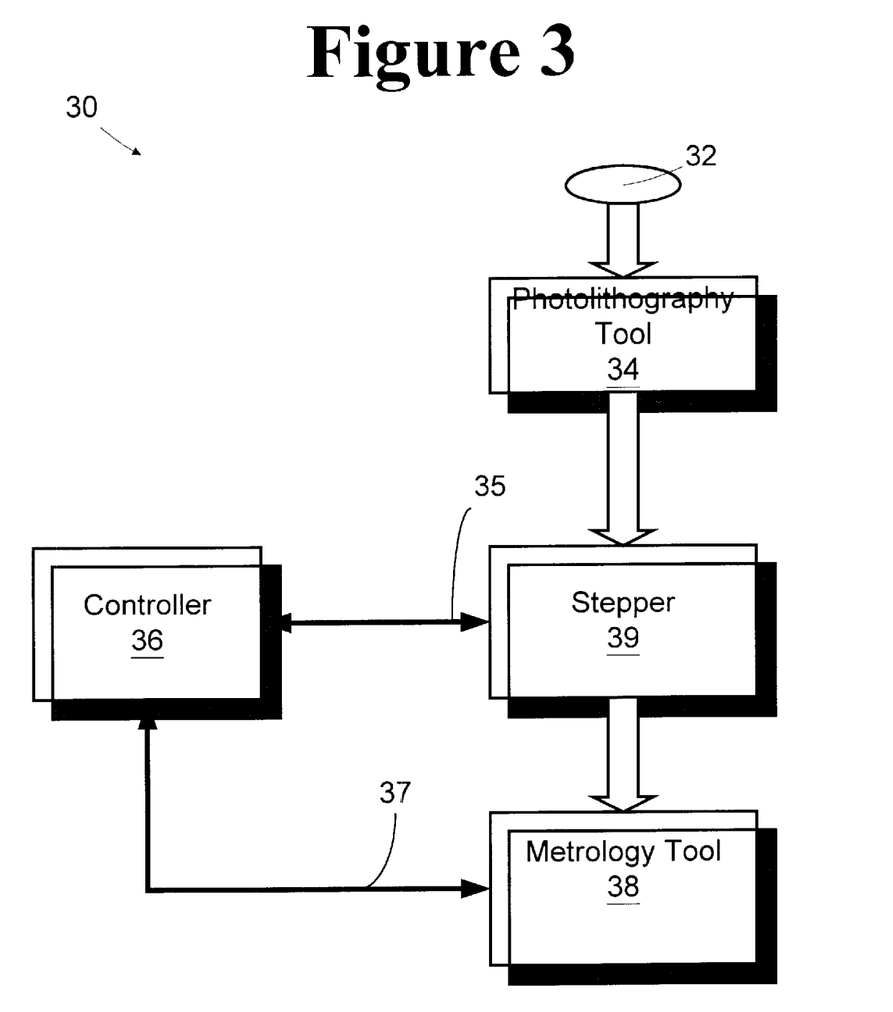
FIG. 3 depicts one illustrative embodiment of a system that may be employed with the present invention.

FIG. 3 depicts one illustrative embodiment of a system 30 that may be used with the present invention. As shown therein, the system 30 for processing wafers 32 is comprised of a photolithography tool 34 used for forming the layer of photoresist 23, an automatic process controller 36, a metrology tool 38, and a stepper 39 for controllably exposing the layer of photoresist 23 to a light source. In some embodiments, the metrology tool 38 may not be needed, as sufficient feedback information for controlling parameters of the optical system of the stepper 39, such as focus, may be obtained from sensors (see FIG. 4) within the stepper 39.

The controller 36 may take a variety of forms. For example, the controller 36 may be included within the stepper 39 or metrology tool 38, or it may be a separate device electrically coupled to the stepper 39 via a line 35 or the metrology tool 38 via a line 37. In the embodiment illustrated herein, the controller 36 takes the form of a computer that is controlled by a variety of software programs. The software programs that directly relate to controlling and or monitoring the light source within the stepper 39 are discussed in greater detail below in conjunction with FIGS. 5 and 6. Those of ordinary skill in the art will appreciate that the controller 36 need not rely on software for its functionality, but rather, a hardware controller may be used to provide the functionality described herein and attributed to the controller 36. Further, the controller 36 need not be coupled only to the stepper 39 and/or the metrology tool 38, but rather, could be coupled to and involved in controlling or collecting data from the photolithography tool 34 or other devices involved in the manufacture of semiconductor devices.

The metrology tool 38 may be any of a variety of devices used to measure electrical and/or structural features on the wafer 32 after being processed by the stepper 39. For example, the metrology tool 38 may be configured to measure certain electrical characteristics, such as current, voltage, resistance, power consumption, conductivity, or the like, and provide the measurement data to the controller 36 over the line 37. Such a metrology tool is available from HP Corp. as model number 4071. Alternatively, the metrology tool 38 may be configured to measure feature sizes on the wafer 32, such as line width, gate width, spacing, and the like, and provide the measurement data to the controller 36. Measurements of this type may be useful in determining critical dimensions of features on the wafer 32. Such a metrology tool is available from KLA Corp. as model number 8100. While The metrology tool 38 is shown receiving the wafer 32 directly from the stepper 39, it is contemplated that in some embodiments of the instant invention additional devices (not shown) may be deployed intermediate the stepper 39 and metrology tool 38. These intermediate devices may perform additional processes, such as cleaning, rinsing, forming additional layers, etc.

Figure 4:
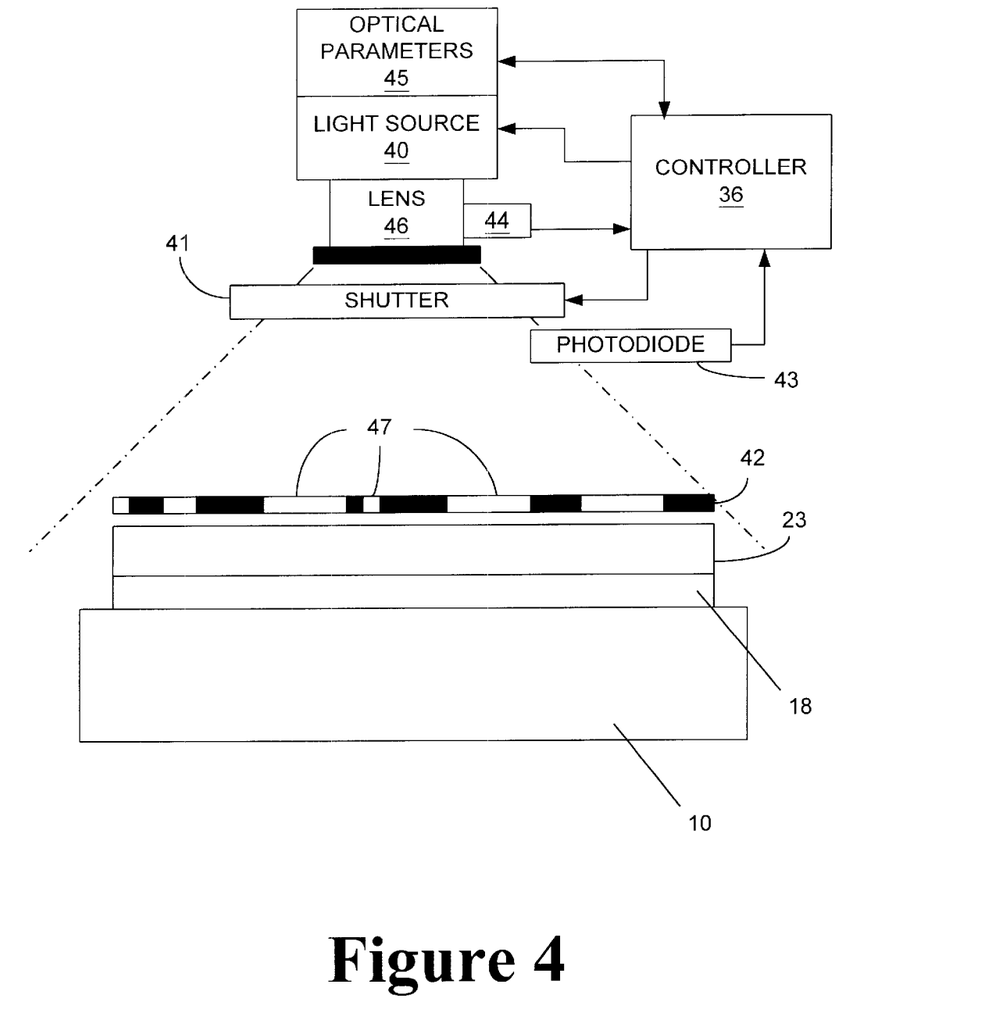
FIG. 4 illustrates a stylized view of operative components of a stepper of FIG. 3.

The stepper 39 may be any of a wide variety of devices used to expose the layer of photoresist 23 to a light source, e.g., a 1500 manufactured by ASML. Generally, as shown in FIG. 4, the stepper 39 includes a plurality of operational components. A light source 40 is positioned above the wafer 10 with a shutter 41 interposed therebetween. Generally, the shutter 41 is operated by the controller 36 between open and closed positions. In the open position, light energy from the light source 40 passes through the shutter 41 and a mask or reticle 42 to impinge upon the layer of photoresist 23. Alternatively, when the shutter 41 is closed, substantially no light energy from the light source 40 reaches the layer of photoresist 23.

A photodose sensor 43, such as a photodiode, is positioned to receive light energy from the light source 40 and provide a signal indicative of the light intensity to the controller 36. The light intensity signal is used by the controller 36 in one embodiment as at least one parameter for controlling the shutter 41. The photodiode 43 may be positioned on either side of the shutter 41 to receive light energy from the light source 40 during at least the time that the shutter 41 is open, and in some instances, at all times.

Additional sensors 44 may be disposed within the stepper 39 to measure a variety of environmental conditions, such as temperature, pressure, humidity, and the like. The measurements of these environmental conditions may be used to vary certain control parameters of the stepper 39 to enhance its operation. For example, the environmental conditions may be used to control certain optical parameters 45 of the stepper 39. That is, the temperature of the stepper, such as the temperature of a lens 46 used to focus the light onto the surface of the photoresist 23 may be measured, and then used to adjust the focus of the lens 46 to compensate for variations induced by fluctuations in the temperature. Any of a variety of conventional temperature sensors may be employed to sense the temperature of the lens 46 without departing from the spirit and scope of the instant invention. One exemplary sensor 44 that may be used to measure the temperature of the lens 46 is available from Omega as part number OS550.

Alternatively, rather than directly measuring the temperature of the lens 46, it may be possible to estimate the temperature of the lens 46. For example, since the stepper 39 "knows" the intensity and duration that the lens 46 is exposed to the light source 40, it can estimate the temperature of the lens 46 using a lookup table or formula. The lookup table and formula may be derived either empirically or theoretically. One exemplary formula for estimating the temperature of the lens 46 is:

$$\text{Temperature} = (\text{Intensity})^{1/4}(k_0 + k_1 \cdot t + k_2 \cdot t^2)$$

Where t is the time of exposure and $k_0, k_1, k_2$ are constants determined by characterization experiments performed at or near operating conditions.

The present invention may be employed on a lot-by-lot basis and/or on a wafer-by-wafer basis. In general, the more frequent the measurements, the more accurate will be the focusing of the light energy delivered to the layer of photoresist 23. That is, the focus of the light source 40 need not be measured at each exposure, but rather, a previous measurement ay be used by the controller 36 to control the focus of the optical system. The number of wafers processed between measurements is a matter of design discretion, which depends substantially on the details of the particular embodiment.

Light passing through the shutter 41 ultimately impinges on the layer of photoresist 23 after passing through a photomask or reticle 42. The light causes the layer of photoresist 23 in areas below optically transmissive regions 47 of the photomask 42 to change character or otherwise develop. The nature of this development may be affected by the character of the optical parameters 45 associated with the light source 40. The metrology tool 38 may be programmed to measure aspects of select features on the wafer 32, such as the size or shape of the developed layer of photoresist 23, the size or shape of a gate of a transistor formed on the wafer 32, the size or shape of metal traces formed on the wafer 32, or the like. The size and/or shape of these features may be used as an indication that the optical parameters 45 are not at their ideal setting. For example, if the metrology tool 38 and controller 36 determine that a gate on the wafer 32 is larger than desired, then the controller 36 may alter the focus of the lens 46 to raise or lower the focal plane to move the light image to a desired height relative to the layer of photoresist 23.

Alternatively, the metrology tool 38 may be programmed to measure electrical aspects of select features on the wafer 32, such as the conductivity/resistance associated with a test pad, the presence/absence of a signal on a test pad, or the like. The electrical characteristics of these features may be used as an indication that the optical parameters 45 are not at their ideal setting. For example, if the metrology tool 38 and controller 36 determine that a test pad has a resistance that is higher than desired, then the controller 36 may alter the focus of the lens 46 to raise or lower the focal plane to move the light image to a desired height relative to the layer of photoresist 23. The variation in resistance may be correlated to the test pad or its underlying connectivity being misaligned or too small, which may cause an increased resistivity.

In the illustrated embodiment, the automatic process controller 36 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms. are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 36, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 5:
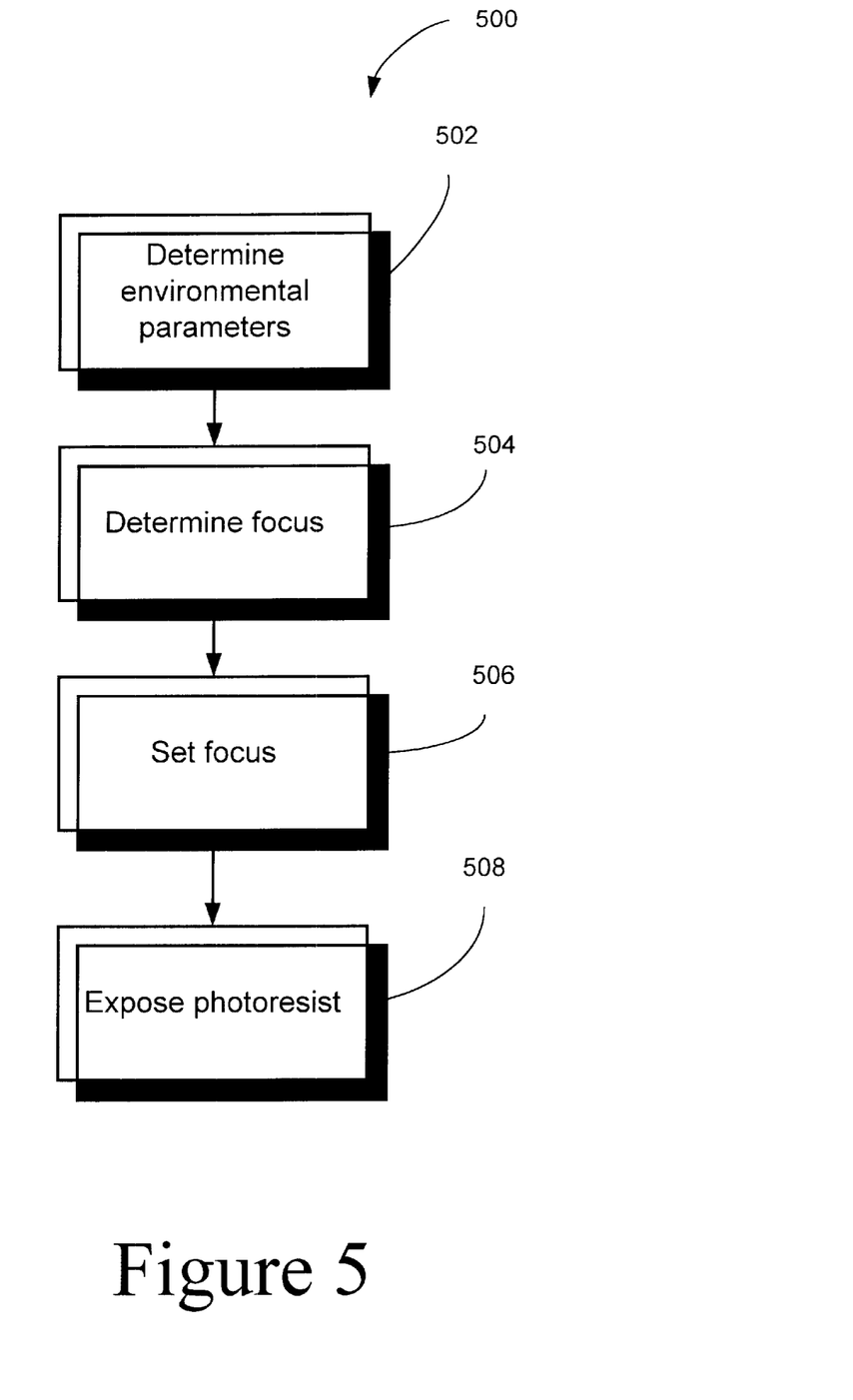
FIG. 5 depicts one illustrative embodiment of the present invention in flowchart form.

Referring to FIG. 5, one illustrative embodiment of a process 500 used to control the stepper 39 is depicted in flowchart form. As shown therein, the present invention comprises the process 500 beginning at block 502 with the controller 36 determining the environmental parameters, such temperature of the lens 46. As discussed above, determining the temperature may be by direct measurement or by estimation. As the temperature of the lens 46 increases, its optical properties vary. Variations in the lens 46 produced by fluctuations in temperature may be compensated for by varying the focus of the lens 46. Accordingly, at block 504, the proper focal setting of the lens 46 may be determined as a function of the temperature. The focal setting may be determined by using a lookup table or by an algorithm. The values in the lookup table may be determined empirically or theoretically.

In either event, once a desired focus of the lens 46 is determined, the controller 36 operates, at block 506, to set the actual focus of the lens 46 at the desired value. Thereafter, the controller 36 operates to open the shutter 41 and expose the layer of photoresist 23 to the light source 40. The duration that the shutter 41 is held open is managed by the controller 36 based upon any of a variety of factors, such as the intensity of the light source 40, as measured by the photodose sensor 43.

Figure 6:
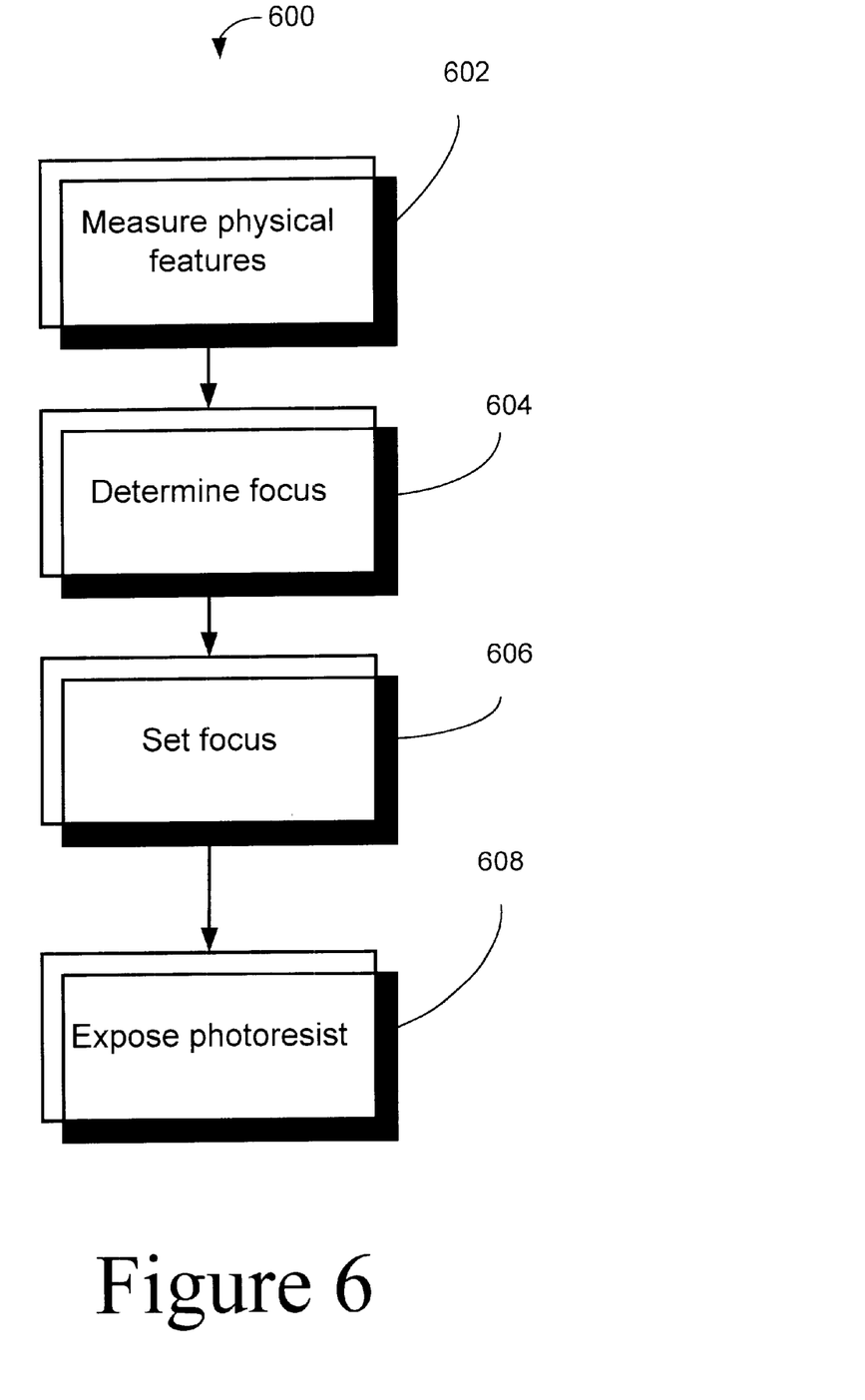
FIG. 6 depicts another illustrative embodiment of the present invention in flowchart form.

Turning now to FIG. 6, an alternative process 600 used to control the stepper 39 in response to data derived by the metrology tool 38 is depicted in flowchart form. As shown therein, the process 600 differs from the process 500 in one respect in that the data derived from the wafer 32 by the metrology tool 38 is used to modify the operation of the stepper 39 for subsequently processed wafers 32. In contradistinction thereto, the process 500 is used to modify the operation of the stepper 39 with respect to the wafer 32 currently being processed.

At block 602, the physical parameters of the wafer 32 are determined by the metrology tool 38. For example, the dimensions of select features on the wafer 32 are measured by the metrology tool 38.

The measurements are compared to the desired size of the select features. This differential is used in block 604 to determine a desired focus and/or a variation in the focus, as compared to its current setting. Accordingly, at block 604, the proper focal setting of the lens 46 may be determined as a function of the differential. The focal setting may be determined by using a lookup table or by an algorithm. The values in the lookup table may be determined empirically or theoretically.

In either event, once a desired focus of the lens 46 is determined, the controller 36 operates, at block 606, to set the actual focus of the lens 46 at the desired value. Thereafter, the controller 36 operates to open the shutter 41 and expose the layer of photoresist 23 to the light source 40. The duration that the shutter 41 is held open is managed by the controller 36 based upon any of a variety of factors, such as the intensity of the light source 40, as measured by the photodose sensor 43.

Figure 7:
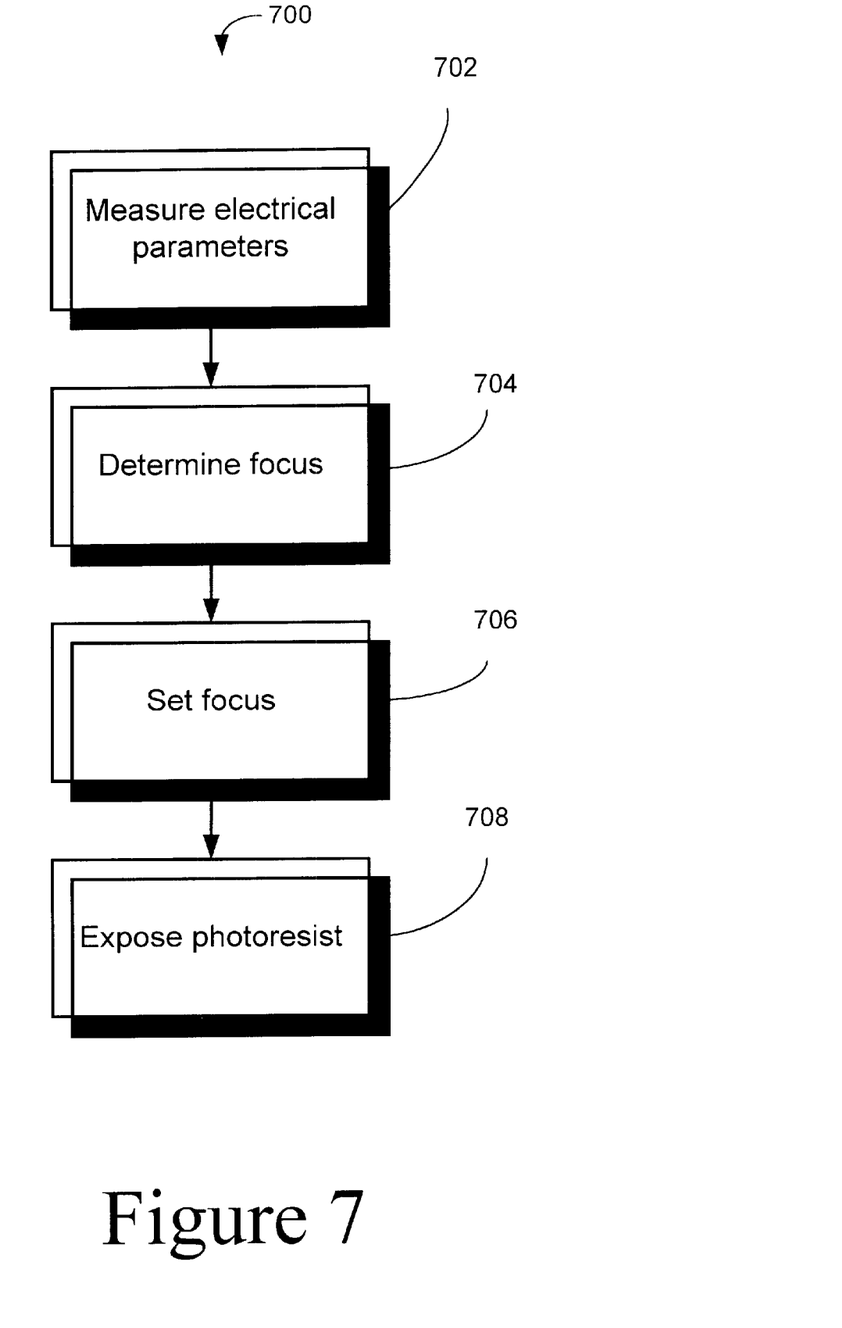
FIG. 7 depicts another illustrative embodiment of the present invention in flowchart form.

Turning now to FIG. 7, an alternative process 700 used to control the stepper 39 in response to data derived by the metrology tool 38 is depicted in flowchart form. As shown therein, the process 700 differs from the process 600 in one respect in that the data derived from the wafer 32 by the metrology tool 38 is based on electrical characteristics of the wafer 32, rather than physical characteristics of the wafer 32.

At block 702, the electrical parameters of the wafer 32 are determined by the metrology tool 38. For example, the resistance of certain conductive regions, such as a test pad on the wafer 32 are measured by the metrology tool 38.

The measurements are compared to the desired characteristics of the selected conductive regions. This differential is used in block 704 to determine a desired focus and/or a variation in the focus, as compared to its current setting. Accordingly, at block 704, the proper focal setting of the lens 46 may be determined as a function of the differential. The focal setting may be determined by using a lookup table or by an algorithm. The values in the lookup table may be determined empirically or theoretically.

In either event, once a desired focus of the lens 46 is determined, the controller 36 operates, at block 706, to set the actual focus of the lens 46 at the desired value. Thereafter, the controller 36 operates to open the shutter 41 and expose the layer of photoresist 23 to the light source 40. The duration that the shutter 41 is held open is managed by the controller 36 based upon any of a variety of factors, such as the intensity of the light source 40, as measured by the photodose sensor 43.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

energizing a light source;

measuring a temperature of a lens used to focus the light source;

determining a desired focus of the lens based upon the measured temperature of the lens;

setting the focus of the lens at the desired focus; and exposing a device to the light source through the lens.

2. An apparatus, comprising:

means for energizing a light source;

means for measuring a temperature of a lens used to focus the light source;

means for determining a desired focus of the lens based upon the measured temperature of the lens;

means for setting the focus of the lens at the desired focus; and means for exposing a device to the light source through the lens.

3. A system, comprising:

a stepper having a light source controllably energizable to provide light to a surface of a semiconductor device;

an optical system having a lens with a controllable focus, said lens being adapted to receive light from the light source and focus the light onto the surface of the semiconductor device;

a controller capable of measuring a temperature of the lens, and controllably varying the focus of the lens in response to the measured temperature of the lens.

4. A system, comprising:

a stepper having a light source controllably energizable to provide light to a surface of a semiconductor device;

an optical system having a lens with a controllable focus, said lens being adapted to receive light from the light source and focus the light onto the surface of the semiconductor device;

a controller capable of determining a temperature of the lens, and controllably varying the focus of the lens in response to the temperature of the lens.

* * * * *